United States Patent [19]

Ienaka et al.

[11] 4,268,762
[45] May 19, 1981

[54] PULSE FORMING CIRCUIT

[75] Inventors: Masanori Ienaka; Takeshi Wada, both of Kodaira; Yukihiko Miyamoto; Tsuneo Yamada, both of Tokyo, all of Japan

[73] Assignees: Hitachi, Ltd.; Trio Kabushiki Kaisha, both of Japan

[21] Appl. No.: 3,911

[22] Filed: Jan. 16, 1979

[30] Foreign Application Priority Data

Mar. 15, 1978 [JP] Japan .................. 53/28660

[51] Int. Cl.³ ............................................. H03K 5/08
[52] U.S. Cl. ................................... 307/268; 307/555; 307/261; 307/358
[58] Field of Search ............... 307/237, 261, 268, 555, 307/296 R, 358; 330/261

[56] References Cited

U.S. PATENT DOCUMENTS

| | | | |
|---|---|---|---|
| 3,173,098 | 3/1965 | Peretz | 307/237 X |
| 3,261,988 | 7/1966 | Johnson | 307/237 X |
| 3,277,385 | 10/1966 | Matsumoto | 330/261 |
| 3,475,622 | 10/1969 | Anderson et al. | 307/228 |
| 4,009,398 | 2/1977 | Yamada et al. | 307/261 X |
| 4,052,626 | 10/1977 | Tuma et al. | 307/261 X |
| 4,182,963 | 1/1980 | Yamada et al. | 307/268 |

Primary Examiner—John S. Heyman
Attorney, Agent, or Firm—Craig and Antonelli

[57] ABSTRACT

A trigger pulse forming circuit for converting a pulse signal into a trigger signal waveform is disclosed. It is characterized in that a time constant circuit is comprised in a collector output circuit of one of a pair of transistors for differential amplification and that a clamp circuit which employs a diode of the base-emitter path of a transistor is inserted between collector output circuits of the transistors for differential amplification. The input pulse signal to be subjected to the waveform conversion is impressed across the bases of the transistors for differential amplification, and the trigger pulse output signal is derived from the collector of the other of the transistors for differential amplification.

5 Claims, 6 Drawing Figures (a)

(b)

PULSE FORMING CIRCUIT

BACKGROUND OF THE INVENTION

This invention relates to improvements in a trigger pulse forming circuit which forms a trigger pulse synchronous with an input pulse signal.

Heretofore, a differentiation circuit which consists only of a resistor and a capacitor has been known as a circuit which forms a trigger pulse for triggering a monostable multivibrator circuit or any other digital circuit. The differentiation circuit, however, has the disadvantage that trigger pulses whose pulse widths and amplitudes are stable cannot be formed on account of the rise and fall times of input pulse signals, the deviation of the time constant of the differentiation circuit, etc.

A circuit shown in FIG. 1 has therefore been proposed. The circuit of FIG. 1 includes a trigger pulse forming circuit, and a pulse shaping circuit which shapes an output from the trigger pulse forming circuit. The trigger pulse forming circuit comprises an emitter-coupled differential amplifier in which the emitters of transistors 1 and 2 are connected in common, the common emitters being grounded through a constant-current source 3. The collector of the transistor 1 is connected to a power supply $+B_2$ through a load resistor 4, while the collector of the transistor 2 is connected to a power supply $+B_1$ through an integration circuit composed of a load resistor 5 and a capacitor 6. Outputs from the transistors 1 and 2 are subjected to an AND operation by diodes 8 and 9. On the other hand, the pulse shaping circuit is constructed of a current switching circuit which comprises transistors 10 and 11 and a constant-current source 12. The voltage $+V_{B1}$ of the power supply $+B_1$ and the voltage $+V_{B2}$ of the power supply $+B_2$ are set in the relationship of $V_{B1} > V_{B2}$.

On the basis of an input pulse signal impressed on an input terminal IN, output pulses having phases opposite to each other are provided at the collectors of the transistors 1 and 2. The output pulse of the transistor 2 is integrated. The logical product between the integrated output and the output pulse from the transistor 1 is taken, to form a trigger pulse. Further, this pulse is waveform-shaped by the current switching circuit, to obtain the shaped trigger pulse. Numerals 7 and 15 designate power supplies for setting threshold levels.

In case of putting the trigger pulse forming circuit into an integrated circuit, it is desirable to make the electrostatic capacity of the capacitor 6 of the integration circuit very small. With the diminution of the electrostatic capacity of the capacitor 6, accordingly, it is required to make the resistance value of the load resistor 5 great and the current of the constant-current source 3 small. Consequently, the output impedance of the trigger pulse forming circuit becomes high, and the driving capability to drive a circuit at the succeeding stage such as pulse shaping circuit, level shifter and flip-flop is degraded. In other words, the trigger pulse forming circuit cannot form trigger pulses which are stable against the dispersions of the values of the circuit elements and the changes of the surrounding conditions including the drift, the change of the ambient temperature, etc. It is therefore problematic to fabricate the prior-art trigger pulse forming circuit in the form of an integrated circuit.

SUMMARY OF THE INVENTION

This invention has been made in view of the above, and has for its object to provide a trigger pulse forming circuit free from the disadvantages.

Another object of this invention is to provide a trigger pulse forming circuit in which transistors constituting the circuit are not operated in the saturation region.

The pulse forming circuit according to this invention is characterized in that a time constant circuit is connected to the collector of one of a pair of transistors for differential amplification, while a load resistor is connected to the other transistor, and that diode means is connected between collector output circuits of the transistors. Further, according to this invention, the collector of the one transistor to which the time constant circuit is connected has a clamp circuit coupled thereto which serves to clamp the collector voltage of the transistor. This facilitates the fabrication of the trigger pulse forming circuit into an integrated circuit, and enables the transistors of the circuit to operate in the non-saturated state.

The above-mentioned objects and features and other features and advantages of this invention will be more fully understood from the following description taken with reference to the accompanying drawings.

DESCRIPTION OF THE PREFERRED EMBODIMENTS

Figure 1:
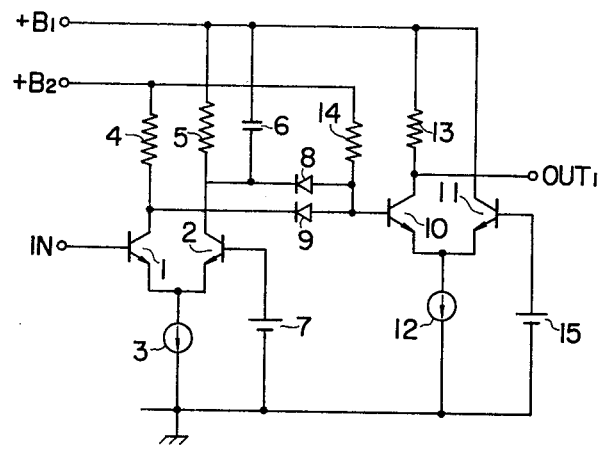
FIG. 1 is a circuit diagram in which a pulse shaping circuit is connected to a prior-art trigger pulse forming circuit.
Figure 2:
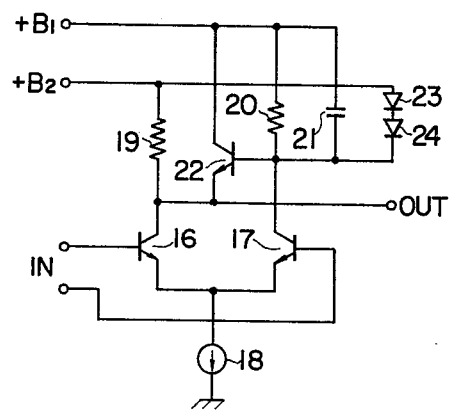
FIG. 2 is a circuit diagram of a trigger pulse forming circuit according to this invention.

FIG. 2 is a circuit diagram of an embodiment of the trigger pulse forming circuit of this invention. Referring to the figure, numerals 16 and 17 designate transistors, the emitters of which are connected in common and then grounded through a constant-current source 18 so as to construct an emitter-coupled differential amplifier. An input pulse signal is applied across the bases of the transistors 16 and 17. The collector of the transistor 16 is connected to a power supply $+B_2$ through a load resistor 19, while the collector of the transistor 17 is connected to a power supply $+B_1$ through an integration circuit which consists of a load resistor 20 and a capacitor 21 connected in parallel therewith. On the other hand, the collector of the transistor 16 is connected to an output terminal OUT and also to the emitter of a transistor 22. The base of the transistor 22 is connected to the collector of the transistor 17, and the collector thereof to the power supply $+B_1$. That is, the base and collector of the transistor 22 are connected to both the ends of the integration circuit. Diodes 23 and 24 connected in series are incorporated between the collector of the transistor 17 and the power supply $+B_2$ as shown in the figure.

The voltage $V_{B1}$ of the power supply $+B_1$ is set at a voltage higher than the voltage $V_{B2}$ of the power supply $+B_2$ so as to obtain a predetermined pulse width.

The operation of the trigger pulse forming circuit of FIG. 2 constructed as above described will be explained.

Figure 3:
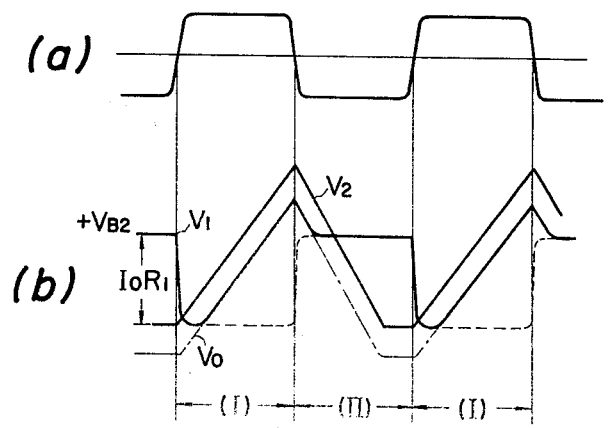
FIG. 3 is a waveform diagram for explaining the operation of the circuit in FIG. 2.

Consider a case where an input pulse signal as illustrated at (a) in FIG. 3 is applied across the bases of the transistors 16 and 17 as an input. Then, when the input pulse signal exceeds a certain threshold level, the transistor 16 falls into the "on" state and the transistor 17 into the "off" state. This status is written as status (I). When the input pulse signal has decreased to or below the level, the transistor 16 falls into the "off" state and the transistor 17 into the "on" state. This status is written as status (II).

When the input pulse signal has changed from the status (II) to the status (I), the transistor 16 shifts from the "off" state to the "on" state, and the transistor 17 vice versa. As illustrated at (b) in FIG. 3, accordingly, the collector voltage $V_1$ of the transistor 16 changes from the voltage $V_{B2}$ of the power supply $+B_2$ to a magnitude $(V_{B2}-I_0 R_1)$. Here, $I_0$ denotes the current of the constant-current source 18, and $R_1$ the resistance value of the load resistor 19. On the other hand, charges stored in the capacitor 21 are discharged owing to the shift of the transistor 17 to the "off" state, and the collector voltage $V_2$ of the transistor 17 increases according to the time constant of the product $R_2 \cdot C$ between the resistance value $R_2$ of the load resistor 20 and the electrostatic capacity C of the capacitor 21 until the status is subsequently changed to (II) or until the collector voltage $V_2$ becomes the supply voltage $V_{B1}$. As described above, the collector voltage $V_1$ of the transistor 16 is at the level $(V_{B2}-I_0 R_1)$. Letting $V_{BE3}$ denote the base-emitter forward voltage drop of the transistor 22, the transistor 22 is in the "on" state in a range in which the relation of $(V_2-V_{BE3})>(V_{B2}-I_0 R_1)$ is held by the transistor 22, and the collector voltage $V_1$ of the transistor 16 becomes $(V_2-V_{BE3})$ and increases with the collector voltage $V_2$ of the transistor 17.

At (b) in FIG. 3, a one-dot chain line $V_O$ indicates the variation of the value of $V_O = V_2 - V_{BE3}$.

Subsequently, when the input pulse signal has changed from the status (I) to the status (II), the transistor 16 shifts from the "on" state to the "off" state, and the transistor 17 vice versa. The collector voltage $V_2$ of the transistor 17 decreases according to the characteristics of the constant-current shource 18 and the capacitor 21. Now, a voltage of the sum between the respective forward voltage drops of the diodes 23 and 24 in the "on" state is denoted by $V_D$. Then, when the collector voltage $V_2$ of the transistor 17 has lowered to a voltage fulfilling the relation of $(V_{B2}-V_D)>V_2$, the diodes 23 and 24 fall into the "on" state, and the collector voltage $V_2$ of the transistor 17 does not decrease to or below the voltage $(V_{B2}-V_D)$.

Subsequently, when the status (II) has changed to the status (I), the collector voltage $V_2$ of the transistor 17 begins to increase from the voltage $(V_{B2}-V_D)$, and one period is completed.

In the above operation, owing to the transistor 22, the collector voltage $V_1$ of the transistor 16 or a voltage to be delivered to the output terminal OUT becomes either higher voltage of the collector voltage of the transistor 16 at the time when the collector of the transistor 16 and the emitter of the transistor 22 are not connected as indicated by a broken line at (b) in FIG. 3 and the emitter voltage $(V_2-V_{BE3})$ of the transistor 22 as indicated by $V_O$ at (b) FIG. 3.

This is equivalent to the execution of the logical sum operation by the transistor 22 between the collector voltage of the transistor 16 at the time when the collector of the transistor 16 and the emitter of the transistor 22 are not connected and the emitter voltage $(V_2-V_{BE3})$ of the transistor 22. Thus, a trigger pulse synchronous with the input pulse signal is formed.

Even when the electrostatic capacity of the capacitor 21 is set to be small and the resistance value of the load resistor 20 is set to be great for the purpose of integrating the circuit shown in FIG. 2, the output impedance of the trigger pulse forming circuit decreases owing to the impedance transform by the transistor 22, and the driving capability of the trigger pulse forming circuit to drive a circuit at the succeeding stage such as pulse shaping circuit, level shifter and flip-flop is satisfactory. Therefore, the problem in putting the trigger pulse forming circuit into an IC is eliminated.

Since the collector voltage of the transistor 17 is clamped by the diodes 23 and 24, the transistor 17 is not saturated on account of fluctuations in the voltages $V_{B1}$ and $V_{V2}$ of the respective power supplies $+B_1$ and $+B_2$ and dispersions in the resistance value $R_2$ of the load resistor 20, the electrostatic capacity C of the capacitor 21 and the operating current.

A modification of the circuit of FIG. 2 may be constructed and operated as below. Two voltage divider resistors connected in series are connected between the power supply $+B_1$ and the ground terminal. The juncture of the two voltage divider resistors is connected to the base of the transistor 17. Thus, the voltage $V_{B1}$ of the power supply $+B_1$ is divided, and a voltage appearing across the voltage divider resistor on the ground side is used as the base input of the transistor 17.

There will now be described a case where a pulse shaping circuit is connected to the trigger pulse forming circuit.

Figure 4:
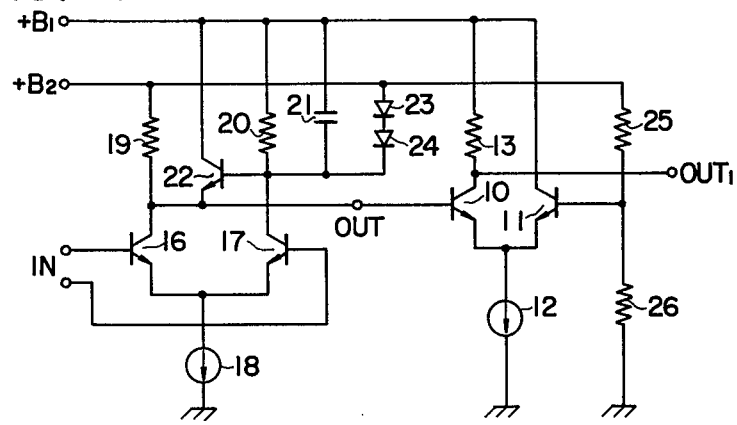
FIG. 4 is a circuit diagram in which a pulse shaping circuit is connected to the trigger pulse forming circuit of FIG. 2.

FIG. 4 is a circuit diagram in which the trigger pulse forming circuit of FIG. 2 has a pulse shaping circuit connected thereto. In FIG. 4, the preceding stage is the trigger pulse forming circuit shown in FIG. 2. A circuit at the succeeding stage is a current switching circuit wherein transistors 10 and 11 are brought into the common emitter connection and the common emitters are grounded through a constant-current source 12 so as to form an emitter-coupled differential amplifier. Further, the base of the transistor 10 is connected to the output terminal OUT of the trigger pulse forming circuit. The collector of the transistor 10 is connected to the power supply $+B_1$ through a load resistor 13, and the collector of the transistor 11 is directly connected thereto. On the other hand, a series circuit consisting of voltage divider resistors 25 and 26 is connected between the power supply $+B_2$ and the ground terminal, and the juncture of the voltage divider resistors 25 and 26 is connected to the base of the transistor 11. The collector of the transistor 10 is connected to an output terminal $OUT_1$.

In the circuit arrangement of FIG. 4, the output voltage of the trigger pulse forming circut is the pulse indicated by $V_1$ at (b) in FIG. 3 which has the high level $+V_{B2}$ and the low level $(V_{B2}-I_0 R_1)$. When this voltage has transistor 11 or the treshold voltage of the current switching circuit, the transistor 10 turns "on", and when it has become equal to or below the threshold voltage, the transistor 10 turns "off". In this way, the output voltage of the trigger pulse forming circuit is delivered to the output terminal $OUT_1$ as a shaped output pulse signal in the opposite phase.

In this case, by dividing the voltage $V_{B2}$ of the power supply $+B_2$ with the voltage divider resistors 25 and 26, the threshold voltage of the current switching circuit can be readily set so that the output of the trigger pulse forming circuit may reliably cross the threshold voltage of the current switching circuit.

Further, by bringing the threshold voltage of the current switching circuit close to the voltage of the power supply $+B_2$, stable output pulses whose pulse widths and amplitude fluctuate little against the dispersions of the values of the circuit elements and the drifts of the circuits can be obtained.

Figure 5:
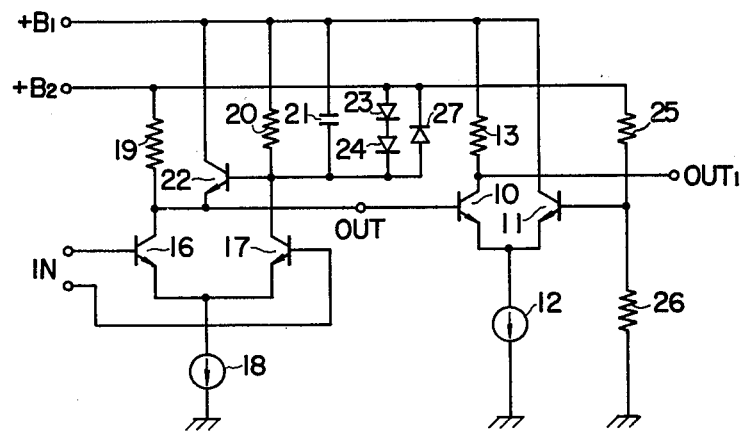
FIG. 5 is a circuit diagram which shows another embodiment of this invention.

FIG. 5 is a circuit diagram showing another embodiment of this invention. The circuit arrangement of FIG. 5 has a construction in which a diode 27 is added to the circuit arrangement shown in FIG. 4. The anode of the diode 27 is connected to the collector of the transistor 17, and the cathode to the power supply $+B_2$.

The trigger pulse forming circuit of FIG. 5 constructed as above described operates as stated hereunder.

Figure 6:
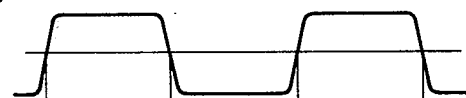
FIG. 6 is a waveform diagram for explaining the operation of the circuit in FIG. 5.
Figure 6:
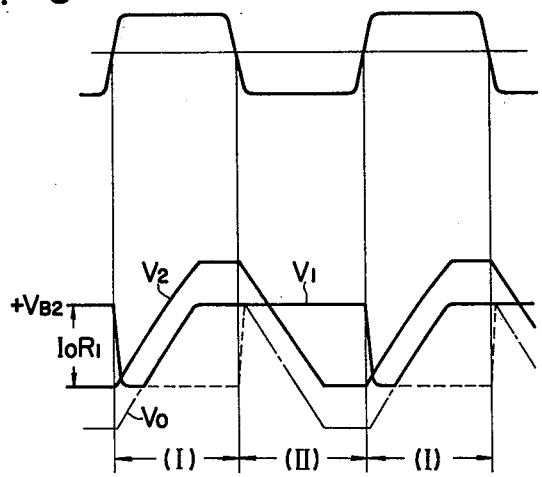

Consider a case where an input pulse signal as illustrated at (a) in FIG. 6 is applied across the bases of the transistors 16 and 17 as an input. Then, when the input pulse signal exceeds a certain threshold level, the transistor 16 falls into the "on" state and the transistor 17 into the "off" state. This status is written as status (I). When the input pulse signal has decreased to or below the level, the transistor 16 falls into the "off" state and the transistor 17 into the "on" state. this status is written as status (II).

When the input pulse signal has changed from the status (II) to the status (I), the transistor 16 shifts from the "off" state to the "on" state, and the transistor 17 vice versa. As illustrated at (b) in FIG. 6, accordingly, the collector voltage $V_1$ of the transistor 16 changes from the voltage $V_{B2}$ of the power supply $+B_2$ to a magnitude $(V_{B2}-I_0 R_1)$. On the other hand, charges stored in the capacitor 21 are discharged owing to the shift of the transistor 17 to the "off" state, and the collector voltage $V_2$ of the transistor 17 increases according to the time constant of the product $R_2 \cdot C$ between the resistance value $R_2$ of the load resistor 20 and the electrostatic capacity C of the capacitor 21. Since, however, the diode 27 is brought into the "on" state by a voltage satisfying the relation of $(V_{B2}+V_{D1})>V_2$ where $V_{D1}$ denotes the forward voltage drop of the diode 27 in the "on" state thereof, the rise of the collector voltage $V_2$ of the transistor 17 is clamped by and stopped at the voltage $(V_{B2}+V_{D1})$. As described above, the collector voltage $V_1$ of the transistor 16 is at the level $(V_{B2}-I_0 R_1)$. Letting $V_{BE3}$ denote the base-emitter forward voltage drop of the transistor 22, the transistor 22 is in the "on" state in a range in which the relation of $(V_2-V_{BE3})>(V_{B2}-I_0 R_1)$ is held by the transistor 22, and the collector voltage $V_1$ of the transistor 16 becomes $(V_2-V_{BE3})$ and increases with the collector voltage $V_2$ of the transistor 17. As stated above, however, the upper limit of the collector voltage $V_2$ of the transistor 17 is $(V_{B2}+V_{D1})$. In addition, $V_{D1} \doteqdot V_{BE3}$. Therefore, the upper limit of the collector voltage $V_1$ of the transistor 16 becomes the supply voltage $V_{B2}$, and the high level of an output pulse becomes constant at this voltage $V_{B2}$ as illustrated at (b) in FIG. 6.

At (b) in FIG. 6, a one-dot chain line $V_O$ indicates the variation of the value of $V_O=V_2-V_{BE3}$.

Subsequently, when the input pulse signal has changed from the status (I) to the status (II), the operation proceeds similarly to that of the embodiment in FIG. 2 or FIG. 4, and the repetitious explanation is omitted.

With the circuit arrangement of FIG. 5, the high level of the trigger pulse output is clamped at the voltage $V_{B2}$ of the power supply $+B_2$ and becomes constant irrespective of the setting of the voltages of the respective power supplies and the setting of the time constant of the integration circuit for obtaining trigger pulses of an appropriate pulse width and irrespective of the changes of the pulse widths of input pulse signals. For this reason, there is a low possibility that the transistor 10 will be saturated.

As set forth above, according to this invention, even when the capacitance of the capacitor of the integration circuit of the trigger pulse forming circuit is made small, the driving capability to drive the circuit at the succeeding stage is not degraded, and the fabrication in the form of an IC is easy.

As compared with the prior-art trigger pulse forming circuit, the circuit of this invention does not become a complicated circuit arrangement, and it suffices with substantially the same number of circuit elements.

The transistor saturation drawback due to the fluctuations of the supply voltages and operating current of the trigger pulse forming circuit, the dispersions of the values of the resistor and the capacitor constituting the integration circuit, and the drifting is preventable by the present invention.

Furthermore, by clamping the collector voltage of that transistor constituting the differential amplifier of the trigger pulse forming circuit which is not on the output terminal side, the voltage at which the collector voltage of the transistor begins to rise is fixed, and trigger pulses whose amplitudes and pulse widths are stable against the fluctuations of the supply voltages and the operating current, the dispersions of the values of the resistor and the capacitor constituting the integration circuit, and the drifts can be formed.

In case where the pulse shaping circuit is connected at the succeeding stage, the trigger pulse forming circuit of this invention is advantageous in that the threshold voltage of the pulse shaping circuit can be easily set and that trigger pulses which are stable against the dispersions of the values of the circuit elements and the drift of the circuit can be provided.

What is claimed is:

1. A pulse forming circuit for the wave conversion of a pulse signal, comprising:
   first and second transistors which have their emitters coupled in common with each other into an arrangement of a differential form, at least one of respective bases of said first and second transistors receiving the pulse signal;
   load means connected to a collector of said first transistor;
   a time constant circuit which is connected to a collector of said second transistor;
   power supply means for feeding to said load means and said time constant circuit;
   a clamp circuit which clamps a collector potential of said second transistor in a conductive state thereof and which is coupled to said collector of said second transistor;

a third transistor which has an emitter connected to said collector of said first transistor, a base connected to said collector of said second transistor and a collector connected to said power supply means; and an output terminal which is connected to said collector of said first transistor and which serves to drive an output signal.

2. A pulse forming circuit according to claim 1, wherein said power supply means feeds a first predetermined voltage to said load means, and a second predetermined voltage different from the first one to said time constant circuit.

3. A pulse forming circuit according to claim 2, wherein said second predetermined voltage is a voltage higher than said first predetermined voltage.

4. A pulse forming circuit according to claim 1, wherein said clamp circuit is made up of a diode which is connected between said collector of said second transistor and said power supply means.

5. A pulse forming circuit comprising an emitter-coupled differential amplifier which consists of a first transistor to be fed with a voltage from a first power supply and a second transistor to be fed with a voltage different from that of said first power supply from a second power supply and to which an input pulse signal is applied, a load resistor which is connected to an output end of said first transistor, an integration circuit which is connected to an output end of said second transistor, a third transistor whose base and collector are respectively connected to both ends of said integration circuit and whose emitter is connected to said output end of said first transistor, at least one diode whose anode is connected to said first power supply and whose cathode is connected to said output end of said second transistor, and a terminal which derives a pulse output from said output end of said first transistor.

* * * * *